US006838946B2

(12) United States Patent
Bazarjani

(10) Patent No.: US 6,838,946 B2
(45) Date of Patent: Jan. 4, 2005

(54) CIRCUIT AND METHOD FOR ADJUSTING CIRCUIT TOLERANCES

(75) Inventor: Seyfollah Bazarjani, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/409,552

(22) Filed: Apr. 7, 2003

(65) Prior Publication Data

US 2003/0231026 A1 Dec. 18, 2003

Related U.S. Application Data

(60) Provisional application No. 60/371,664, filed on Apr. 10, 2002.

(51) Int. Cl.[7] .............................................. H03L 7/00
(52) U.S. Cl. ........................ 331/16; 331/17; 327/552; 327/553; 327/557
(58) Field of Search .................... 331/16, 17; 327/552, 327/553, 557

(56) References Cited

U.S. PATENT DOCUMENTS 5,416,438 A * 5/1995 Shibata ...................... 327/552

FOREIGN PATENT DOCUMENTS

| EP | 0910165 | 4/1999 | .......... H03H/11/12 |
| GB | 2170969 | 11/1985 | ............ H03H/3/00 |

* cited by examiner

*Primary Examiner*—Arnold Kinkead
(74) *Attorney, Agent, or Firm*—Philip Wadsworth; Charles D. Brown; Howard H. Seo

(57) ABSTRACT

A frequency response adjuster for a frequency responsive circuit, and a method for tuning a frequency response of a circuit, are disclosed. The adjuster may include a time constant sensor, wherein a charging state of the frequency responsive circuit may be measured by, and output from, the time constant sensor as a first voltage, a converter that samples the first voltage and outputs a second voltage resultant from a conversion of the first voltage by the converter, an array of trimming components, and a selector that utilizes the second voltage to select at least one trimming component from the array of trimming components. The method includes the steps of sensing a time constant of the circuit, outputting the sensing as a first voltage, sampling the first voltage over a fixed interval, converting the sampled first voltage to a second voltage, and selecting, utilizing the second voltage, at least one trimming component from an array of trimming components. The time constant of the circuit may be trimmed by the at least one trimming component selected.

14 Claims, 6 Drawing Sheets

CIRCUIT AND METHOD FOR ADJUSTING CIRCUIT TOLERANCES

RELATED APPLICATIONS

This application claims priority from U.S. Provisional Application No. 60/371,664, filed on Apr. 10, 2002.

BACKGROUND OF THE INVENTION

1. Field of the Invention

The invention relates to an apparatus and method for adjusting frequency response of a reactive circuit, and, more specifically, to the trimming of a main RC circuit by component selection within the main RC circuit.

2. Description of the Background

Active RC circuits are used in electronics applications known in the art. Such circuits are employed in the design of continuous time analog integrated circuits, such as analog filters and sigma delta converters. In a typical integrated circuit application, resistors and capacitors created as part of the integrated circuit are created within predetermined tolerance levels. The frequency response of these integrated RC circuits depend on the absolute value of the resistors and capacitors, and the tolerances thereof. Typically, an on-chip resistance varies within a tolerance of plus or minus 20% of desired value, and an on chip capacitance may vary, for example, within a tolerance of plus or minus 10%. Therefore, the RC time constant of a given circuit may vary within up to plus or minus 30% tolerance level. Unfortunately, in many applications of RC circuit technology, a variation of plus or minus 30% may be not within acceptable limits.

An RC circuit may be a first order low pass filter with −3 dB bandwidth frequency of $1/(2\pi RC)$. In higher order filters, the product of RC defines filter frequency response. The product of resistance and capacitance, tau, may be the time constant of the RC circuit in seconds, where R may be the resistance in Ohms, and C may be the capacitance in Farads of the RC circuit. As may be known to those possessing an ordinary skill in the pertinent art, a capacitor does not charge at a steady rate. Rather, the rate of charge for a capacitor may be rapid at first, and may slow considerably as the capacitor reaches full charge. During each time constant value, tau, the capacitor charges 63.2% of the remaining distance to the maximum voltage charge level. A capacitor may be 99.33 percent charged at the end of five time constant values, and may be charged to 99.9 percent of its final value after 6.9 time constant values.

Similarly, a capacitor does not discharge at a steady rate. Rather, the rate of discharge may be rapid at first, and slows considerably as the charge on the capacitor approaches zero. During each time constant period, the capacitor discharges 63.2% of the remaining distance to the minimum voltage charge level. A capacitor may be 99.33 percent discharged at the end of five time constant values, and may be discharged to 99.9 percent of its final value after 6.9 time constant values.

Thus, variations in the R and C value may cause unacceptably wide variations in the time constant tau, and may lead to improper time estimates for full charging and discharging of a capacitor in an RC circuit. RC filters employ RC circuitry that may be subject to time constant values. A lack of clarity as to the performance, i.e. the charging and discharging of such a filter, may cause unacceptable performance levels in applications employing filtering, particularly in applications wherein higher order filters are employed. For example, the wireless communication industry, and the hardware employed therein, are highly dependent on filtering processes, thus making wide swings in time constant values unacceptable.

Therefore, the need exists for an apparatus and method for improving the tolerance of an RC circuit, such as an RC filtering circuit.

SUMMARY OF THE INVENTION

An embodiment of the present invention includes a frequency response adjuster for a frequency responsive circuit. The adjuster may include: a time constant sensor; an analog/digital converter that samples a first voltage and outputs a second voltage resultant from an analog/digital conversion of the first voltage by the converter; an array of trimming components; and a selector that utilizes the second voltage to select at least one trimming component from an array of trimming components. The charging state of the frequency responsive circuit may be measured by, and output from, the time constant sensor as a first voltage. The charging state of the frequency responsive circuit may be preferably trimmed by the at least one trimming component selected. A frequency response adjuster may, for example, be included in communication device, in addition to a plurality of primary switches and at least one active communication device circuit. The plurality of primary switches may switch at least one of the time constant sensor, the converter, the array of trimming components, and the selector, between the active communication device circuit and the frequency response adjuster.

The present invention additionally includes a method for tuning a frequency response of a circuit. The method includes the steps of: sensing a time constant of the circuit; outputting the sensing as a first voltage; sampling the first voltage over a fixed interval; converting the sampled first analog voltage to a second voltage in digital format; and selecting, utilizing the second voltage, at least one trimming component from an array of trimming components. The time constant of the circuit may be trimmed by the at least one trimming component selected.

The present invention thus provides an apparatus and method for improving the tolerance of an RC circuit, such as an RC filtering circuit.

BRIEF DESCRIPTION OF THE DRAWINGS

Understanding of the present invention will be facilitated by consideration of the following detailed description of an embodiment of the present invention, taken in conjunction with the accompanying drawings, wherein like numerals refer to like elements, and wherein.

DETAILED DESCRIPTION OF THE INVENTION

It may be to be understood that the figures and descriptions of the present invention have been simplified to illustrate elements that are relevant for a clear understanding of the present invention, while eliminating, for purposes of clarity, many other elements found in a typical circuit environment. Those of ordinary skill in the art will recognize that other elements are desirable and/or required in order to implement the present invention. However, because such elements are well known in the art, and because they do not facilitate a better understanding of the present invention, a discussion of such elements may be not provided herein.

Figure 1:
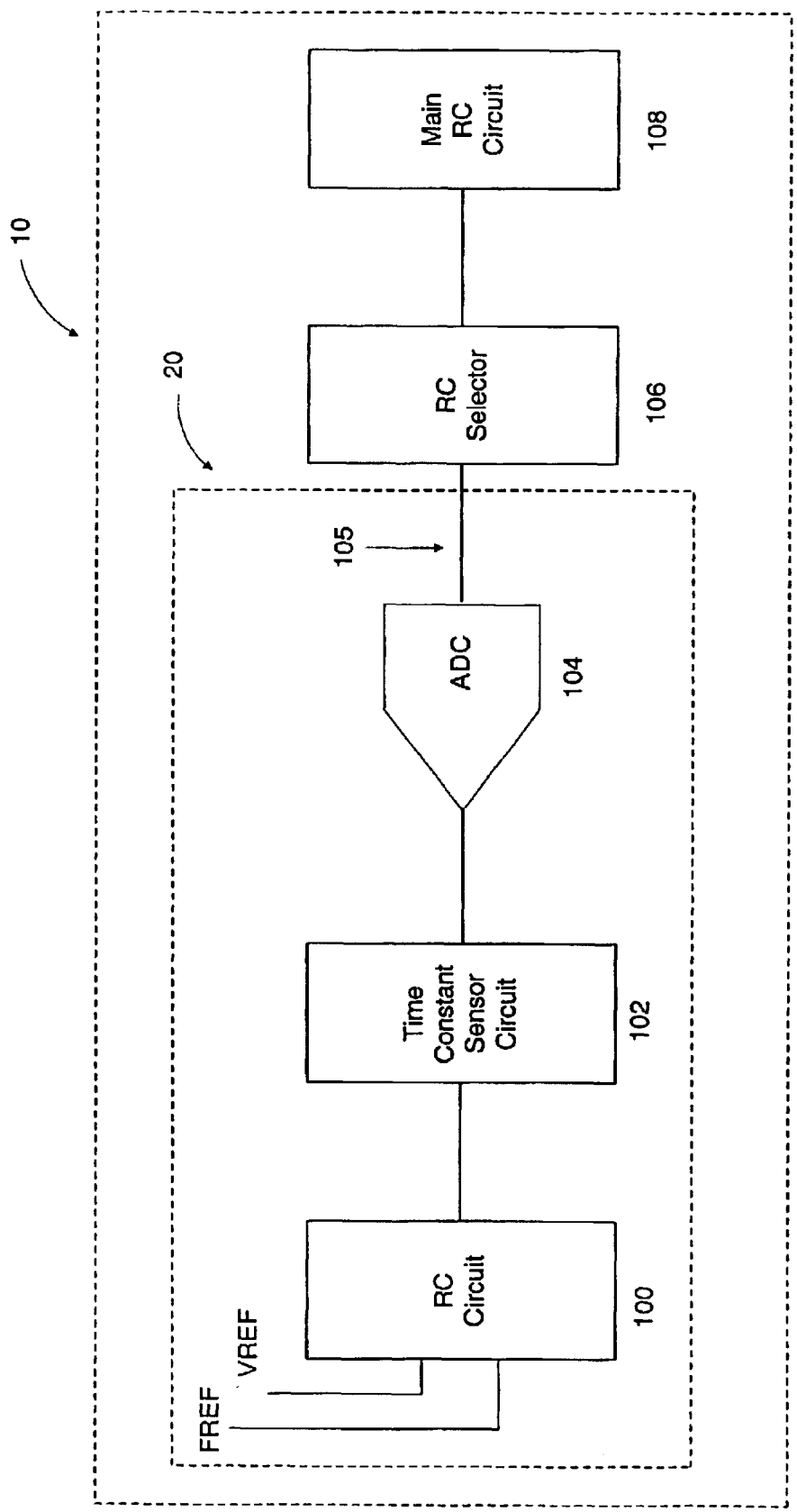
FIG. 1 is a block diagram illustrating a trimming circuit.

Referring now to FIG. 1, there is shown a block diagram illustrating an adjuster 10 for selecting a value of resistance, or capacitance, for a main RC circuit 108. Adjuster 10 may include an RC circuit 100, a time constant sensor 102, an analog-to-digital converter 104, an RC selector 106, and a main RC circuit 108. In selecting the value of resistance or capacitance within the main RC circuit 108, using RC selector 106, the frequency response of main RC circuit 108 may be adjusted, or "trimmed". In an embodiment of the present invention, RC circuit 100 and main RC circuit 108 may be the same circuit. Nonetheless, the figures and the following description describe each as a separate circuit.

Time constant sensor 102 may monitor the RC time constant of an RC circuit 100. The output of time constant sensor 102 may be provided to analog-to-digital converter 104. A digital value 105 of analog-to-digital converter 104 may be used by RC selector 106 to select the value of a capacitor, or a resistor, from, for example, an array of selectable capacitors or resistors, in order to achieve the desired RC time constant of main RC circuit 108.

RC selector 106 may select resistance or capacitance based on a comparison of the current RC time constant value of RC circuit 100, as sensed by time constant sensor circuit 102, to the desired RC time constant value for main RC circuit 108. The hardware employed in the present invention, such as the hardware enumerated in FIG. 1, may include "borrowed" hardware, such as hardware 20 illustratively shown. Borrowed hardware may be otherwise employed within a device, such as within a wireless communication device, during time periods wherein the RC time constant is not being monitored. For example, voltage references and analog to digital converters are frequently employed in wireless devices, and may be "borrowed" for use in adjuster 10 of FIG. 1. This "borrowing" may readily be accomplished through the use of functionally switched blocks of circuitry that switch "borrowed" hardware 20 of FIG. 1, for example, between use by adjuster 10 and use by other device aspects, such as within a wireless mobile device.

Figure 2:
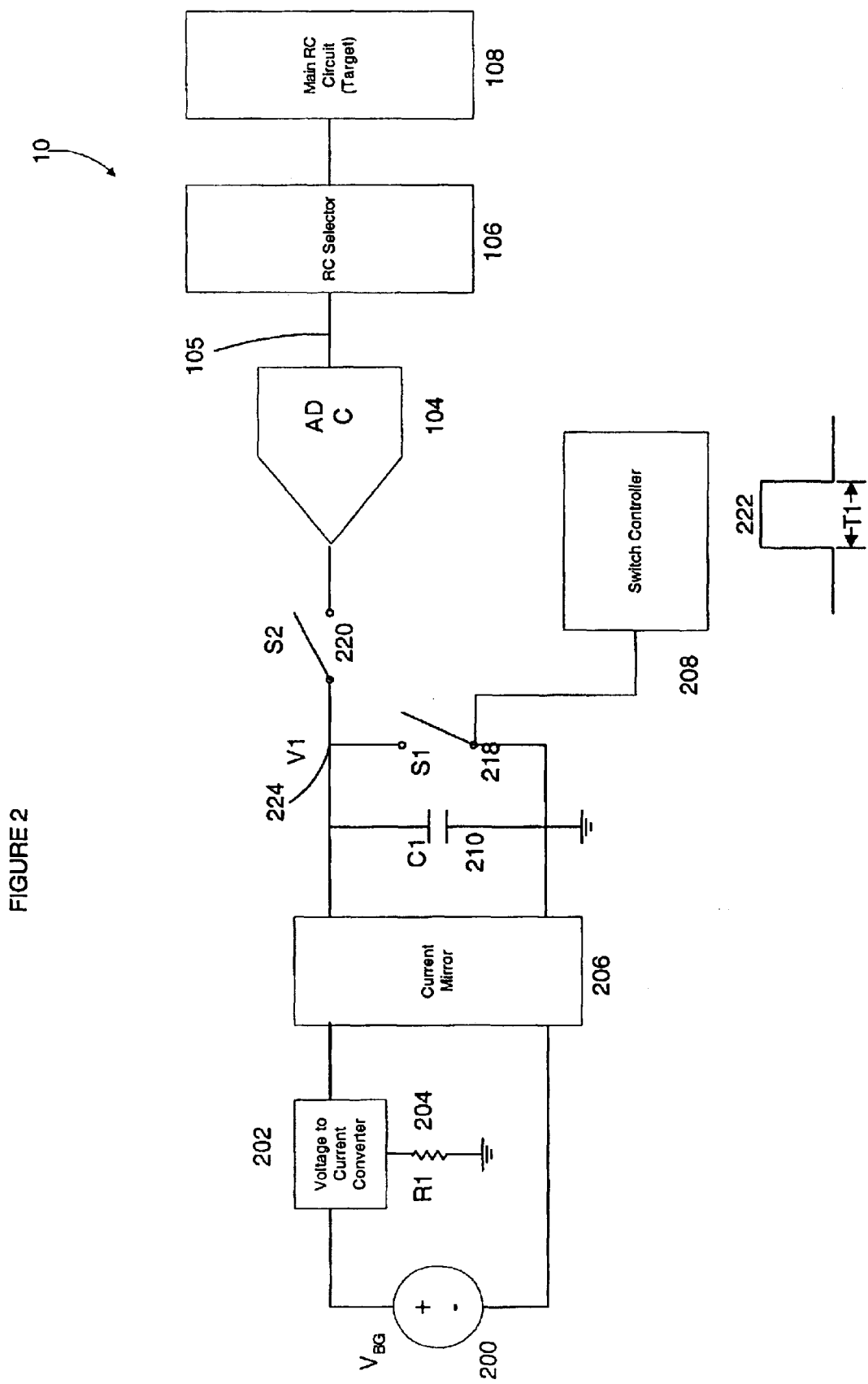
FIG. 2 is a schematic block diagram illustrating an embodiment of a trimming circuit of FIG. 1.

Referring now to FIG. 2, there is shown a combination block diagram and schematic illustrating, with more specificity, an embodiment of adjuster 10 of FIG. 1. Adjuster 10 of FIG. 2 may include a band gap voltage 200 source (VBG) connected to a voltage to current converter 202, which voltage 200 and converter 202 may be connected to a resistor 204, or alternatively to a capacitor (not shown in FIG. 2), of an RC circuit 100. Adjuster 10 may additionally include a current mirror 206, a switch controller 208, a capacitor 210 or a resistor (not shown in FIG. 2) of RC circuit 100 connected to current mirror 206, and an analog-to-digital converter 104. The output of the analog-to-digital converter 104 may feed RC selector 106, which may select the component values for main RC circuit 108. RC circuit 100 and time constant sensor circuit 102, shown in FIG. 1 and discussed hereinabove, illustratively correspond to band gap voltage 200 source, voltage to current converter 202, resister 204, current mirror 206, switch controller 208, capacitor 210 and switches 218, and 220 as shown in FIG. 2.

Band gap voltage 200 source may be any voltage source known to those possessing an ordinary skill in the pertinent art, and may be a voltage source employed within a device in which adjuster 10 may be placed, such as a wireless communications device. For example, band gap voltage 200 sources are popular reference techniques for systems involving integrated circuitry. Band gap voltage 200 reference may have a 1.2 volt output, or other output known to those possessing an ordinary skill in the pertinent art, commensurate with the band gap voltage of the silicon employed therein. Basic operation of band gap voltage 200 source involves the adding of two voltages of opposite temperature dependency, thereby canceling overall temperature dependence. Thus, band gap voltage 200 may be temperature stable.

Voltage to current converter 202 may be any voltage-to-current converter known to those possessing an, ordinary skill in the pertinent art. Voltage to current converter 202 may convert band gap voltage 200 to a current, I, in resistor 204. Voltage to current converter 202 may be a voltage to current converter used by other elements, at time periods during which there is no monitoring of the time constant, within the device in which the system of FIGS. 1 and 2 may be employed.

Current mirror 206 may be any current mirror known to those possessing an ordinary skill in the pertinent art. Current mirror 206 may be modulated, as shown, by switch controller 208, such as a timing control circuit driven by an oscillator, such as a temperature compensated crystal oscillator, or another type of oscillator known to those possessing an ordinary skill in the pertinent art. Switch controller 208 may modulate switches 218 and 220. Switch 218 may be used to control time period 222 during which capacitor 210 may be charged. Switch 218 resets the voltage across capacitor 210 to zero prior to the next time period 222 charging interval. Switch 220 may functionally apply voltage 224 to ADC 104 for sampling and conversion to digital value 105. In this configuration, switch 218 may be normally active while switch 220 is inactive. This may allow ADC 104 to sample the voltage across capacitor 210 following a charging of capacitor 210 for time period 222. The functional timing relationship between switch 218 and switch 220 may be apparent to those possessing an ordinary skill in the pertinent art. Current mirror 206 replicates the magnitude of the current in a first portion of RC circuit 100, such as resistor 204 in FIG. 2, into a second portion of RC circuit 100, such as capacitor 210 in FIG. 2.

Analog-to-digital converter 104 receives voltage V1. Analog-to-digital converter 104 may be, for example, an integrated analog-to-digital converter known to those possessing an ordinary skill in the pertinent art. Analog-to-digital converter 104 may convert analog voltage 224 to digital value 105, which is input to the serially connected RC selector 106 and main RC circuit 108.

In operation, band gap voltage 200 may be converted to a band gap current by voltage to current converter 202, and, for example, resistor 204, which may be an on-chip resistor. This band gap current may be mirrored by current mirror 206 and applied across capacitor 206 for time period 222 by making switch 218 inactive. Voltage 224 developed across capacitor 210 may be measured using ADC 104. From these measurements, R1*C1 may be determined using the following relationships:

$$V1 = I1*T1/C1,$$

and $$I1 = VBG/R1.$$

Consequently:

$$V1 = (VBG/R1)*(T1/C1).$$

The above equations may be solved for R1*C1 (Tau), yielding:

$$Tau = VBG\ T1/V1,$$

wherein VBG represents band gap voltage 200, T1 represents time period 222, and V1 represents voltage 224. VBG may be, for example, 1.2 volts. T1 may be derived from the known frequency source, and V1 may be measured by ADC 104.

Tau as derived, in conjunction with digital value 105, may be used to select the resistance or capacitance in main RC circuit 108 necessary to achieve the precise desired RC value in main RC circuit 108. Selector circuit 106 may employ a switch driver, which will be apparent to those skilled in the art, to select the necessary resistance or capacitance from a resistive or capacitive array available to selector 106, in order to achieve the desired RC value for trimming in main circuit 108. From the foregoing, it may be possible to trim the value deviations of R or C components by assessing variation in time period 222, which is the RC time constant of RC circuit 100.

For example, if T1 is one RC time constant, Tau, V1, after one RC time constant, may be equal to 0.632 VBG, and RC may be as designed. If T1 is (1+0.15) of one time constant, then V1 after (1+0.15) RC time constant may be equal to 0.683 VBG, and RC may be approximately 15% above RC circuit component values. If T1 is (1−0.15) of one time constant, then V1 after (1−0.15) RC time constant may be equal to 0.572 VBG, and RC may be approximately 15% below RC circuit component values. Thereby, a known tolerance differential between the measured RC circuit component values and target RC circuit component values allows for a trimming by varying the RC value commensurate with the known offset.

It will also be apparent to those skilled in the art that a trimming of capacitors, rather than of resistors, may be performed in order to gain the desired performance of the main RC circuit. It will additionally be apparent that switching may be performed to place elements into, and out of, the main RC circuit and/or the selector, and further to place elements into, and out of, the main RC circuit, the selector, and/or the remaining circuits of the device in which the main RC circuit and/or the selector are employed.

Figure 2A:
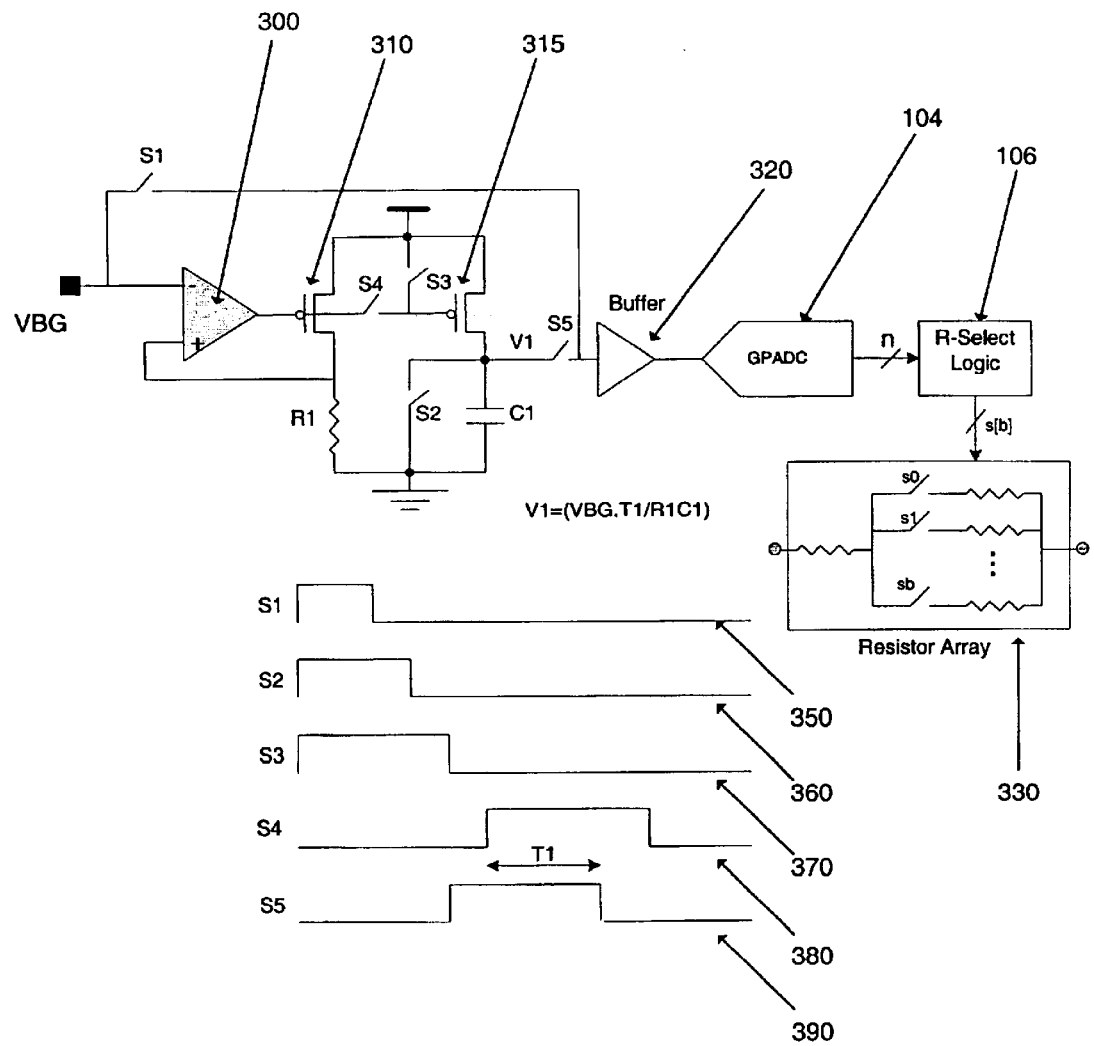
FIG. 2A is a schematic diagram of an embodiment of the trimming circuit illustrated in FIGS. 1 and 2.

Embodiments of adjuster 10 are illustrated in FIGS. 2A, B and C. Referring now to FIG. 2A, there is shown a schematic diagram of an embodiment of the trimming circuit illustrated in FIGS. 1 and 2. As is shown in FIG. 2A, the adjuster 10 may include switches S1–S5, resistor R1, capacitor C1, buffer 320, and analog-to-digital converter 104, electrically connected as shown.

Adjuster 10, as shown in FIG. 2A, may have input band gap voltage electrically connected to operational amplifier 300. The output of operational amplifier 300 is electrically connected to a transistor 310, which may be, for example, a MOSFET transistor, such as a P-MOSFET. Transistor 310 is electrically connected to a resistor R1. Another input to operation amplifier 300 is electrically connected between resistor R1 and transistor 310. Transistor 310 is similarly connected to switches S4 and S3. Switch S3 is similarly connected to transistor 315, which may be a transistor, such as a MOSFET. Transistor 315 is connected to buffer 320. Also connected to buffer 320 is VBG. In series with the output of buffer 320 is placed ADC 104, RC selector 106 and resistor array 330. Resistor array 330 may be substituted with a capacitive array, not shown. Of note, operational amplifier 300, transistor 310, and resistor R1 form a voltage to current converter, and transistors 310 and 315 form a current mirror, in the exemplary embodiment illustrated.

As may be seen in FIG. 2A, each of switches S1–S5 may be controlled according to the corresponding timing pulse, 350–390, by placing the switch in one of two operating states, namely active or inactive. For example, as shown in FIG. 2A, switch S1 may initially be active. Similarly, switches S2 and S3 may be initially active, while switches S4 and S5 may be initially inactive. While S1 remains active, capacitor C1 may substantially discharge and the trimming process may progress with a measurement of voltage VBG. Upon discharge of capacitor C1, switches S1, S2 and S3 may switch to inactive. Switch S5 may switch to active upon switching of switch S3 from active to inactive, followed by a switching of switch S4 to active. Switch S5 may remain active for at least one time constant T1. Voltage V1 may be sampled after one time constant T1, while switches S1, S2 and S3 remain inactive, and switches S4 and S5 remain active. As will be apparent to those skilled in the pertinent art, if the values of voltages V1 and VBG are measured, and time constant T1 is known as equal to R1C1, RC may be solved for using:

$$V1 = (VBG*T1/RC),$$

or:

$$RC = (VBG*T1/V1).$$

After RC is calculated from the equation above, selection of proper R (or C) from a resistor array (or a capacitor array) may be achieved.

Figure 2B:
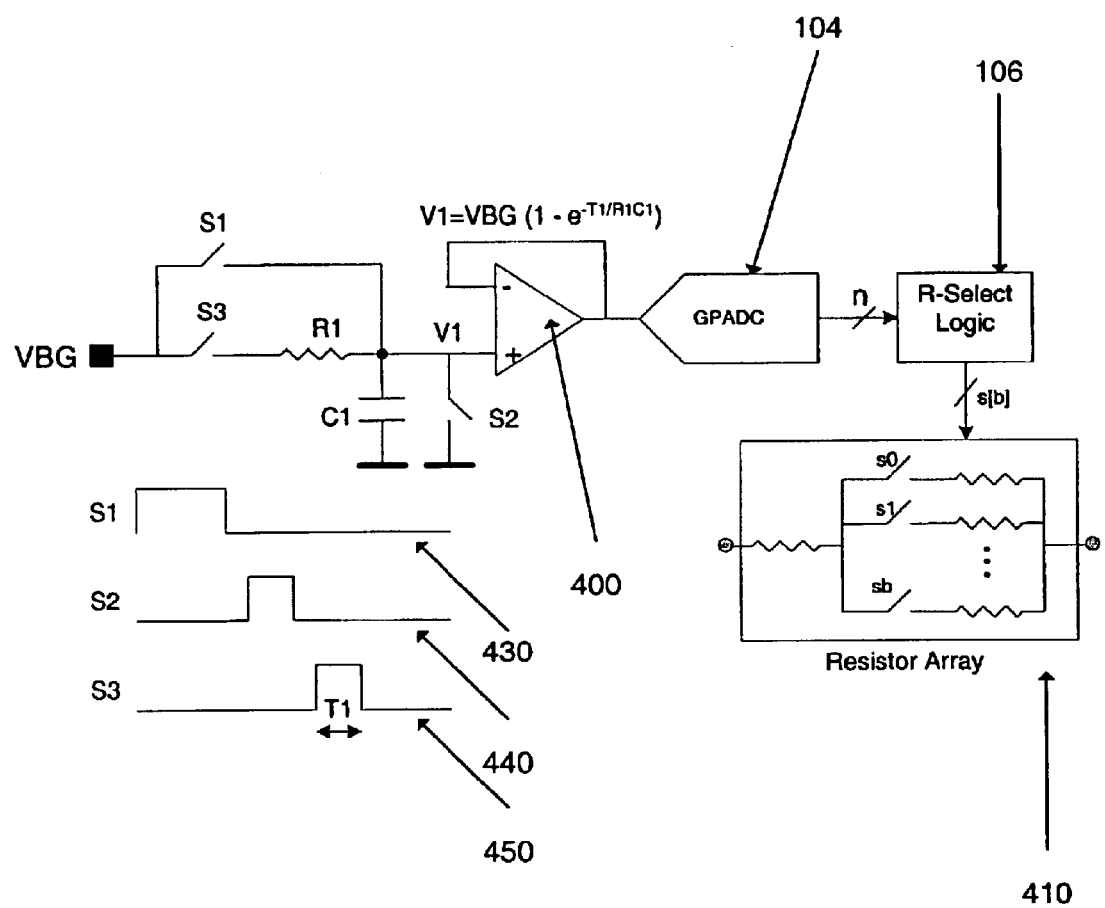
FIG. 2B is a schematic diagram of an embodiment of the trimming circuit illustrated in FIGS. 1 and 2; and, FIG. 2C is a schematic diagram of an embodiment of the trimming circuit illustrated in FIGS. 1 and 2; and, FIG. 3 is a flow diagram of an embodiment of the trimming circuit.

Referring now to FIG. 2B, there is shown a schematic diagram of an embodiment of the trimming circuit illustrated in FIGS. 1 and 2. In FIG. 2B, the adjuster 10 may include a voltage VBG, switches S1–S3, a resistor R1, a capacitor C1, and an analog-to-digital converter, electrically connected as shown.

The trimming circuit shown in FIG. 2B includes VBG connected to switch S3, in series with resistor R1. Switch S2 and capacitor C1 are in parallel and connected to resistor R1. Switch S1 is placed in parallel with the series of switch S3 and resistor R1. Resistor R1 is connected to the input of operational amplifier 400, the output of which provides feedback. The output of operational amplifier 400 is connected in series to ADC 104, RC selector 106 and a resistor array 410. Resistor array 410 may be substituted with a capacitive array, not shown.

The trimming process in this configuration is performed substantially described in FIG. 2A hereinabove. For example, switch S1 may initially be active, while switches S2 and S3 may be inactive, as may be seen from timing signal 430–450. In this configuration, voltage VBG may be measured when S1 is active, and capacitor C1 may be discharged when S2 is active. From this initial configuration, switch S1 may become inactive, and switches S2 and S3 may be active in sequential fashion. Voltage V1 may be measured after switch S3 is active for at least one time constant T1, or for some known portion of the time constant. As in FIG. 2A above, if the values of voltages V1 and VBG are measured, and time constant T1 is known as equal to R1C1, RC may be solved for using:

$$V1=VBG(1-e^{-T1/RC}),$$

or:

$$RC=T1/(-\ln(1-(V1/VBG))).$$

After RC is known, selection of proper R (or C) from a resistor array (or a capacitor array) may be achieved.

Figure 2C:
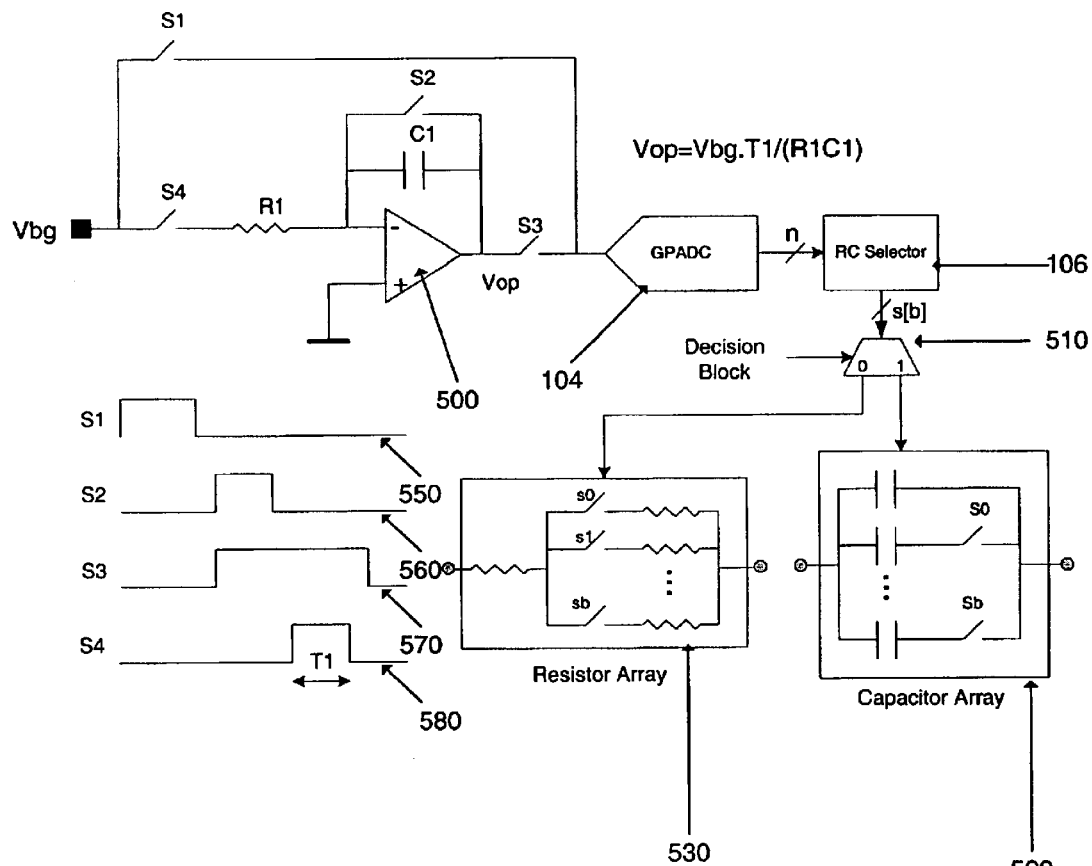

In FIG. 2C, there is shown a schematic diagram of an embodiment of the trimming circuit illustrated in FIGS. 1 and 2. In FIG. 2C, the adjuster 10 may include a voltage VBG, switches S1–S4, a resistor R1, a capacitor C1 and an analog-to-digital converter, electrically connected as shown.

The trimming circuit shown in FIG. 2C, includes VBG electrically connected to switch S4, resistor R1, and operational amplifier 500. Operational amplifier 500 is output across switch S3. Between the connection of operational amplifier and switch S3, there is connected a parallel capacitor C1 and switch S2, which is connected to the interconnection of resistor R1 and operational amplifier 500. In series with operational amplifier 500 output and switch S3 is ADC 104, RC selector 106, and a decision block 510. The decision block 510 is connected to both a capacitor array 520 and a resistor array 530. Of note, resistor R1, operational amplifier 500, and capacitor C1 form an active RC integrator during T1.

The trimming process in this configuration may be performed substantially as described with respect to FIGS. 2A and 2B. As an initial condition, switch S1 may be active, while switches S2–S4 may be inactive, as may be seen from timing signals 550–580. In this configuration, voltage VBG may be measured. Switch S1 may become inactive, at which time switches S2 and S3 may become active. While switch S3 remains active, switch S2 becomes inactive, followed by switch S4 becoming active. During activation of switch S2, C1 may be discharged. Switch S4 activates and remains active for at least time constant T1, and Vop may be measured. Similarly to FIG. 2B above, if the values of voltages Vop and VBG are measured, and time constant T1 is known equal to R1C1, RC may be solved for using:

$$Vop=VBG\,T1/(RC)$$

or:

$$RC=VBG\,T1/Vop.$$

After RC is known, selection of proper R (or C) from resistor array (or a capacitor array) may be achieved.

Figure 3:
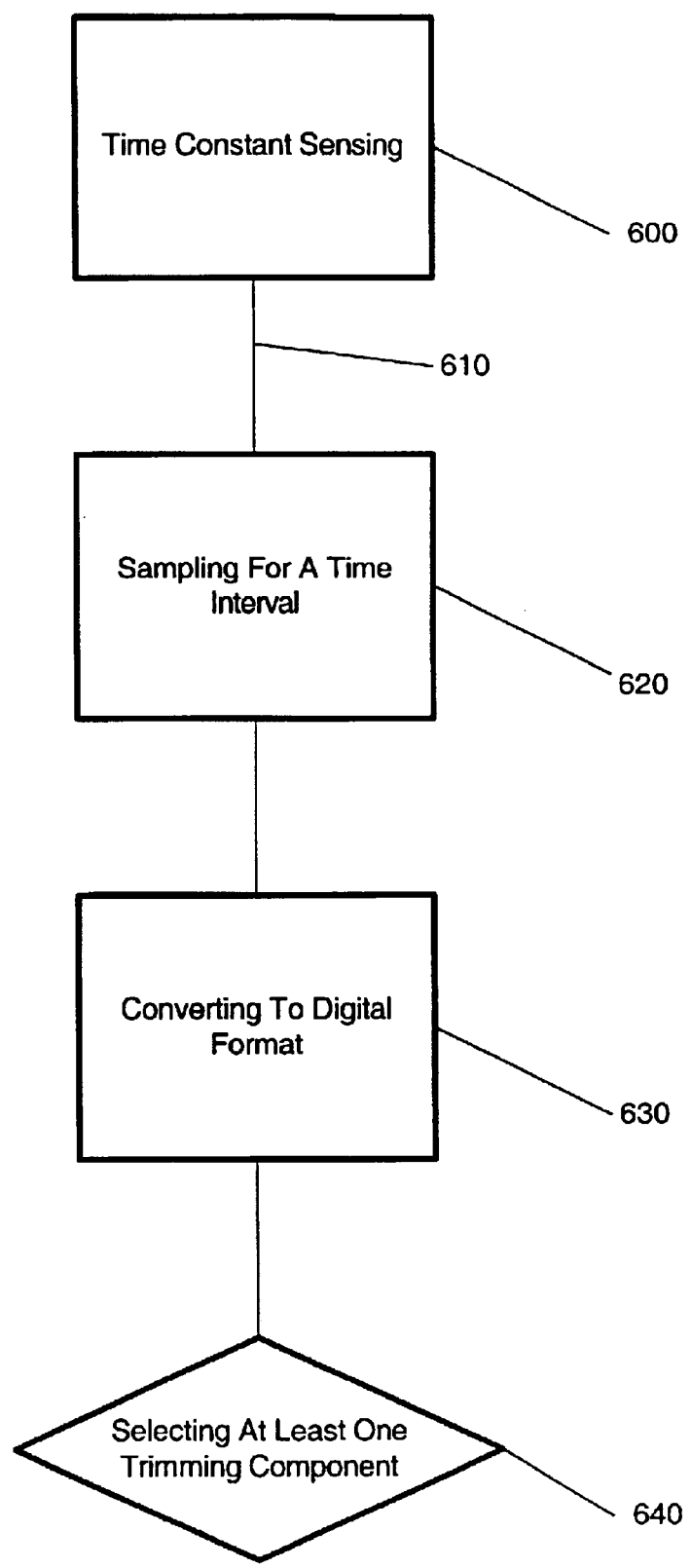

Referring now to FIG. 3, there is shown a flow diagram for tuning the frequency response of a circuit according to an aspect of the present invention. Tuning includes sensing a time constant of the circuit 600, outputting the sensing as a first voltage 610, and sampling the first voltage over a fixed interval 620, such as one RC time constant, for example. Further, tuning may include converting the sampled first voltage to a second voltage 630, such as by an analog-to-digital conversion, for example, and selecting, utilizing the second voltage, at least one trimming component from an array of trimming components 640. Selecting at least one trimming component 640 may include actuating a plurality of switches each communicatively connected to a resistance, a capacitance, or both. The time constant of the circuit may be trimmed by the at least one trimming component selected.

It will be apparent to those skilled in the art that various modifications and variations may be made in the apparatus and process of the present invention, without departing from the spirit or scope of the invention. Thus, it may be intended that the claims herein cover the modifications and variations of this invention, provided that those modifications and variations are within the scope of the claims and the equivalents thereof.

What I claim is:

1. An adjuster for tuning a frequency response of a circuit, comprising:
   a time constant sensor, wherein a charging state of the circuit may be measured by, and output from, said time constant sensor as a first voltage;
   a converter that samples the first voltage and outputs a second voltage resultant from a conversion of the first voltage by said converter;
   an array of trimming components; and
   a selector that utilizes the second voltage to select at least one trimming component from said array of trimming components;
   wherein the charging state of the circuit may be trimmed by the at least one trimming component selected from, and wherein said time constant sensor further comprises a switch controller that controls at least one charging switch, and upon activation of the charging switch, the circuit enters the charging state.

2. The adjuster of claim 1, wherein said charging state may be responsive to a band gap voltage reference.

3. The adjuster of claim 1, wherein said time constant sensor further comprises a sampling switch controlled by said switch controller, wherein, upon deactivation of the charging switch and activation of the sampling switch, the charging state may be measured.

4. The adjuster of claim 1, wherein said converter may be an analog to digital converter, and wherein said second voltage comprises a digital voltage.

5. The adjuster of claim 1, wherein said selector comprises at least one switch selectively actuated by said second voltage.

6. The adjuster of claim 1, wherein the at least one trimming component comprises at least two resistors.

7. The adjuster of claim 1, wherein the at least one trimming component comprises at least two capacitors.

8. An adjuster for trimming frequency responses of a plurality of components, comprising:
   means for providing a charged state for the plurality of components;
   means for switching between the charged state of the plurality of components, and a sampling state of the plurality of components, over a fixed interval;
   means for sampling the charged state of the plurality of components during the sampling state, and converting the sampled state into a digital control value indicative of the sampled state; and
   means for selecting at least one trimming component, in response to the digital control value, for switched placement into the plurality of components to adjust the charged state.

9. The adjuster of claim 8, wherein said means for providing a charged state comprises a silicon band gap voltage.

10. The adjuster of claim 8, wherein the fixed interval may be established by a crystal oscillator.

11. The adjuster of claim 8, wherein said means for sampling and converting comprises an analog to digital converter.

12. The adjuster of claim 8, wherein said means for selecting comprises a plurality of solid state switches, wherein said switches apply the at least one trimming component.

13. The adjuster of claim 8, wherein the at least one trimming component comprises at least one selected from the group consisting of resistors and capacitors.

14. A communication device, comprising:
- a plurality of primary switches;
- at least one active communication device circuit;
- a frequency response adjuster for a frequency responsive circuit, including:
  - a time constant sensor, wherein a charging state of the frequency responsive circuit may be measured by, and output from, said time constant sensor as a first voltage;
  - a converter that samples the first voltage and outputs a second voltage resultant from a conversion of the first voltage by said converter;
  - an array of trimming components; and
  - a selector that utilizes the second voltage to select at least one trimming component from said array of trimming components;
- wherein the charging state of the frequency responsive circuit may be trimmed by the at least one trimming component selected;
- wherein said plurality of primary switches switches at least one selected from the group consisting of said time constant sensor, said converter, said array of trimming components, and said selector, between said active communication device circuit and said frequency response adjuster.

* * * * *